(12) United States Patent
Riaf

(10) Patent No.: US 8,963,337 B2
(45) Date of Patent: Feb. 24, 2015

(54) THIN WAFER SUPPORT ASSEMBLY

(75) Inventor: Arthur Paul Riaf, Gloucester, MA (US)

(73) Assignee: Varian Semiconductor Equipment Associates, Gloucester, MA (US)

( * ) Notice: Subject to any disclaimer, the term of this patent is extended or adjusted under 35 U.S.C. 154(b) by 542 days.

(21) Appl. No.: 12/893,355

(22) Filed: Sep. 29, 2010

(65) Prior Publication Data

US 2012/0074591 A1 Mar. 29, 2012

(51) Int. Cl.
*H01L 23/48* (2006.01)
*H01L 23/52* (2006.01)
*H01L 29/40* (2006.01)
*H01L 21/76* (2006.01)
*H01L 21/30* (2006.01)
*H01L 21/46* (2006.01)
*H01L 21/00* (2006.01)
*H01L 21/425* (2006.01)
*B44C 1/22* (2006.01)
*C03C 15/00* (2006.01)
*C23F 1/00* (2006.01)
*B01D 59/44* (2006.01)
*H01J 49/00* (2006.01)
*A61N 5/00* (2006.01)
*G21G 5/00* (2006.01)
*G21K 5/10* (2006.01)
(Continued)

(52) U.S. Cl.
CPC ...... *H01L 21/67346* (2013.01); *H01L 21/6836* (2013.01)
USPC ........... 257/777; 257/783; 438/406; 438/455; 438/464; 438/514; 216/62; 250/281; 250/492.1; 250/492.2; 250/492.21; 250/492.3

(58) Field of Classification Search
CPC ..................... H01L 21/67346; H01L 21/6786; H01L 21/02; H01L 21/02002; H01L 21/67; H01L 21/67763; H01L 21/6836; H01L 2221/67; H01L 2221/683; H01L 2221/68304; H01L 2221/68318; H01L 2221/68463
USPC .......... 257/777, 783; 438/406, 455, 464, 514; 216/62; 250/281, 492.1, 492.2, 492.21, 250/492.3
See application file for complete search history.

(56) References Cited

U.S. PATENT DOCUMENTS 5,476,566 A * 12/1995 Cavasin ...................... 156/249
6,212,767 B1 * 4/2001 Tandy ............................ 29/836
(Continued)

FOREIGN PATENT DOCUMENTS

EP 1883106 A2 1/2008
WO 2004006296 A2 1/2004
WO WO 2010029876 A1 * 3/2010 ............. H04N 5/225

OTHER PUBLICATIONS

"Temporary Bonding Enables New Processes Requiring Ultra-thin Wafers"; Solid State Technology; http://www.electroiq.com/article/sst/print/volume-53/issue-2/features/cover-article/temporary-bonding.html; retrieved Sep. 20, 2010, 4 pages.

*Primary Examiner* — Teresa M Arroyo
(74) *Attorney, Agent, or Firm* — Kacvinsky Daisak and Bluni PLLC

(57) ABSTRACT

A semiconductor wafer assembly formed by bonding a support wafer to a thin wafer using a double-sided bonding release tape. The support wafer provides support for the thin target wafer such that existing handling tools can accommodate transporting and processing the assembly without compromising the profile of the thin target wafer.

14 Claims, 7 Drawing Sheets

(51) Int. Cl.
*H01J 37/08* (2006.01)
*H01L 21/673* (2006.01)
*H01L 21/683* (2006.01)

(56) References Cited

U.S. PATENT DOCUMENTS

| | | | |
|---|---|---|---|
| 6,553,658 B2* | 4/2003 | Tandy | 29/836 |
| 6,752,931 B2* | 6/2004 | Dewa | 216/2 |
| 6,852,608 B2* | 2/2005 | Kitamura et al. | 438/464 |
| 6,939,741 B2* | 9/2005 | Fukuoka et al. | 438/114 |
| 7,169,685 B2* | 1/2007 | Connell et al. | 438/460 |
| 2002/0016135 A1 | 2/2002 | Iwasaki et al. | |
| 2002/0081822 A1* | 6/2002 | Yanagita et al. | 438/455 |
| 2003/0134578 A1 | 7/2003 | Strasbaugh et al. | |
| 2005/0142815 A1* | 6/2005 | Miyazaki et al. | 438/464 |
| 2005/0215030 A1 | 9/2005 | Yamamoto | |
| 2006/0079011 A1* | 4/2006 | Tandy et al. | 438/14 |
| 2006/0154445 A1* | 7/2006 | Iwabuchi | 438/458 |
| 2007/0026572 A1* | 2/2007 | Hatakeyama et al. | 438/113 |
| 2007/0045232 A1* | 3/2007 | Murai et al. | 216/88 |
| 2007/0114609 A1* | 5/2007 | Akino et al. | 257/347 |
| 2008/0088036 A1* | 4/2008 | Matsumura et al. | 257/783 |
| 2008/0096365 A1* | 4/2008 | Chitnis | 438/455 |
| 2008/0185700 A1* | 8/2008 | Takamatsu et al. | 257/678 |
| 2008/0286948 A1* | 11/2008 | Miyazaki et al. | 438/464 |
| 2009/0311849 A1* | 12/2009 | Andry et al. | 438/464 |
| 2011/0189808 A1* | 8/2011 | Watanabe et al. | 438/66 |
| 2011/0248190 A1* | 10/2011 | Tanaka et al. | 250/492.21 |

* cited by examiner

THIN WAFER SUPPORT ASSEMBLY

BACKGROUND OF THE INVENTION

1. Field of the Invention

Embodiments of the invention relate to the field of semiconductor device fabrication. More particularly, the present invention relates to an apparatus and method for handling thin wafers in existing implantation and deposition processing tools.

2. Discussion of Related Art

Ion implantation is a process used to dope impurity ions into a semiconductor substrate to obtain desired device characteristics. In one implantation method, an ion beam is directed from an ion source chamber toward a substrate. The depth of implantation into the substrate is based on the ion implant energy and the mass of the ions generated in the source chamber. One or more ion species may be implanted at different energy and dose levels to obtain desired device structures.

The throughput of device fabrication depends heavily on the wafer handling tools used with ion implanters to achieve low cost manufacture of the desired semiconductor devices. The overall throughput of these devices is a function of both the processing time and the efficiency of automated wafer handling. Generally, wafer handling involves introduction of the wafers in a wafer carrier into the processing tool, transfer of the wafers from the wafer carrier to a processing station, return of the wafers to the wafer carrier following processing and removal of the wafer carrier from the processing tool. Such wafer handling systems usually include one or more load locks for transferring wafers to and from a vacuum process chamber. The wafer carrier may be a FOUP (Front Opening Unified Pod), which is a standardized wafer carrier utilized for transporting wafers in fabrication facilities, or a cassette.

With the increasing demand for smaller, higher performing and lower cost semiconductor devices, thin semiconductor wafers having thicknesses of less than 250 µm are being used. These thin wafers typically have diameters of 8", 12", 16", etc. However, these thin wafers are less stable, less flat, prone to breaking and vulnerable to various stresses during processing all of which negatively impact device throughput. In particular, thin wafers have a non-planar, wavy profile when left unsupported. Thus, the thin wafers cannot be oriented for implantation which requires a flat surface for uniform doping. Existing electrostatic clamps used to retain and flatten these thin wafers on the platen do not work well since only low current may be employed resulting in low retention forces which may compromise desired implantation. In addition, thin wafers sag when placed in existing wafer carriers and the larger diameter wafers may break when housed in cassettes. This sagging may also limit the number of wafers that may be stacked in existing cassettes. Moreover, handling systems in current process tools do not accommodate these thin wafers which may slide off during transfer from, for example, a load lock to a process chamber or vice versa. Accordingly, there is a need to provide a support assembly for thin wafers in existing processing systems.

SUMMARY OF THE INVENTION

Exemplary embodiments of the present invention are directed to a wafer assembly to support thin wafers for processing. In an exemplary embodiment, a semiconductor wafer assembly includes a support wafer having a diameter and a thin target wafer bonded to the support wafer. The target wafer has a diameter less than or equal to the diameter of the support wafer. In an exemplary method for forming a semiconductor wafer assembly, a first side of a double sided release tape is exposed. An upper surface of a support wafer is attached to the first side of the double sided release tape. A second side of the double sided release tape is exposed and a bottom surface of a thin target wafer is attached to the second side of the double sided release tape such that the support wafer and thin target wafer are bonded together.

DESCRIPTION OF EMBODIMENTS

Figure 1:
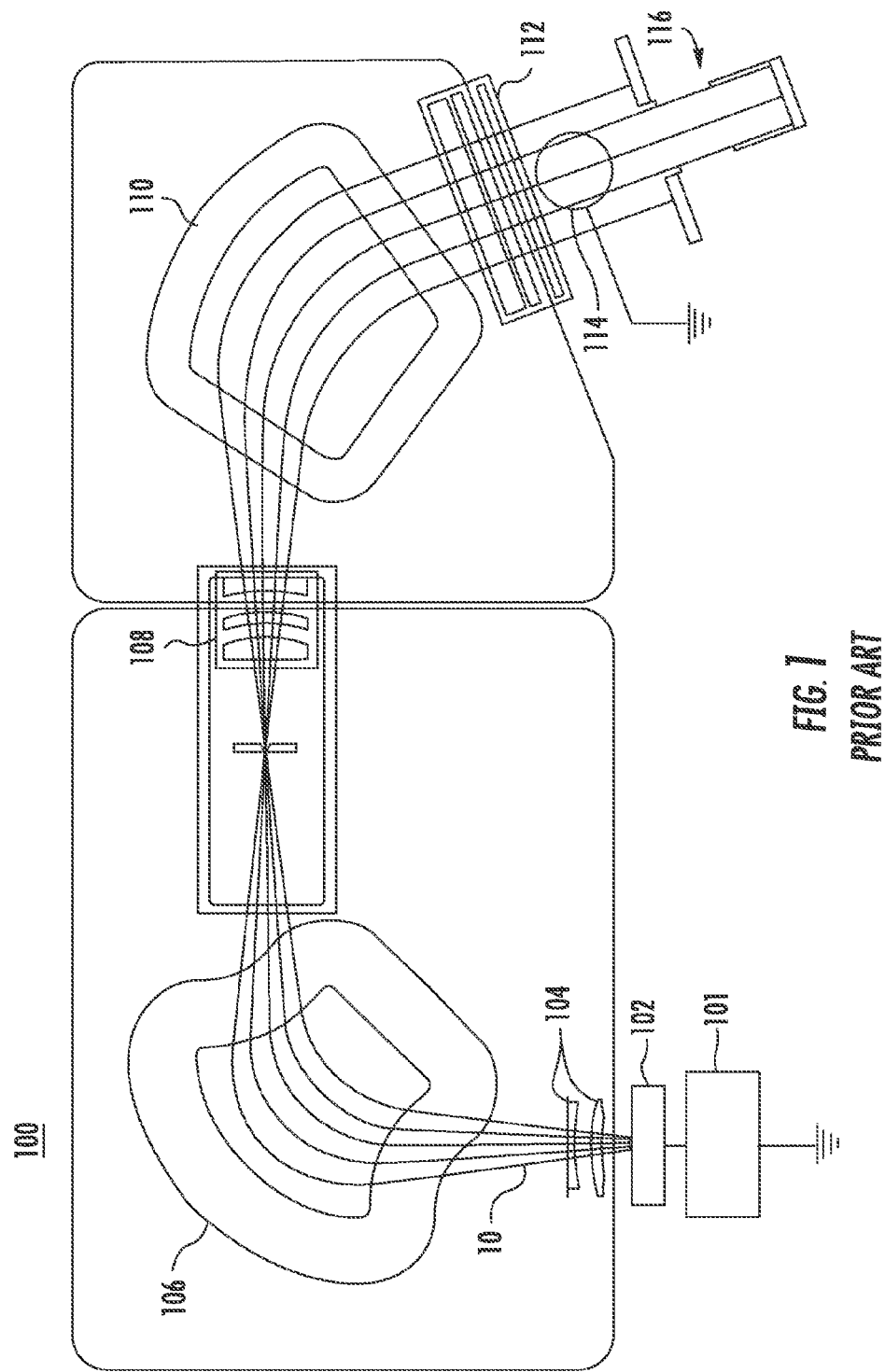
FIG. 1 illustrates a block diagram of a representative ion implanter.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a block diagram of an ion implanter 100 including an ion source chamber 102. A power supply 101 supplies the required energy to source 102 which is configured to generate ions of a particular species. The generated ions are extracted from the source through a series of electrodes 104 and formed into a beam 10 which passes through a mass analyzer magnet 106. The mass analyzer is configured with a particular magnetic field such that only the ions with a desired mass-to-charge ratio are able to travel through the analyzer for maximum transmission through the mass resolving slit 107. Ions of the desired species pass from mass slit 107 through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some embodiments, a second deceleration stage 112 may be disposed between corrector magnet 110 and support 114. The ions lose energy when they collide with electrons and nuclei in the substrate and come to rest at a desired depth within the substrate based on the acceleration energy.

As mentioned above, wafers having thicknesses of less than 250 µm are generally considered thin. These thinner wafers are being used to manufacture smaller, higher performing and lower cost semiconductor devices such as those used in flat panel displays, solar cells, etc. In order to use these thin wafers with existing handling tools of implanter 100 (shown in FIG. 1), a support substrate is adhered underneath the thin wafer to form a wafer assembly or combination. The support substrate 305 is a standard wafer having a diameter that is larger and may be thicker than the thin target wafer such that existing handling tools can accommodate transporting and processing the assembly without compromising the profile of the thin target wafer.

Figure 2A:
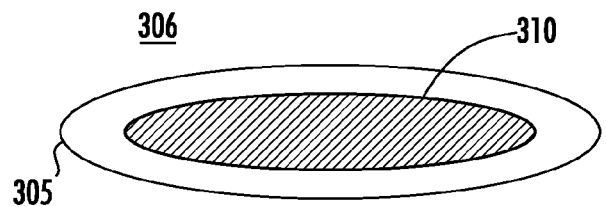
FIG. 2A is a perspective view of an exemplary wafer assembly in accordance with an embodiment of the present disclosure.
Figure 2B:
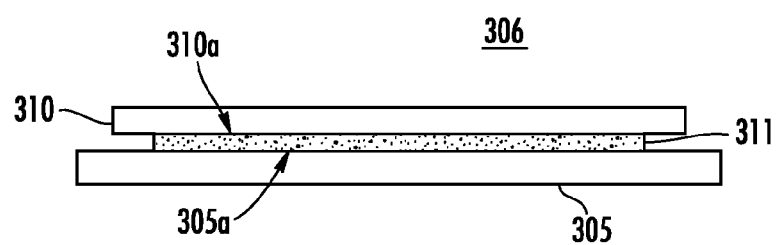
FIG. 2B is a side cross-sectional view of an exemplary wafer assembly in accordance with an embodiment of the present disclosure.

FIGS. 2a and 2b generally illustrates the assembly 306 of a target thin wafer 310 adhered to a support substrate or standard wafer 305 using a two-sided bonding or release tape 307 disposed therebetween. FIG. 2A is a perspective view of the wafer assembly and FIG. 2B is a side cross-sectional view of the wafer assembly. The release tape 307 is disposed between the support wafer 305 and thin target wafer 310. In particular, the release tape 307 adheres to the underside 310a of the thin target wafer 310 and the upper surface 305a of the support wafer 305. The target thin wafer 310 and support wafer 305 are bonded together using release tape 307 such that air bubbles are avoided to create an adequate seal between the wafers to accommodate wafer processing and handling. The support wafer 305 is a standard size wafer (200 mm, 300 mm) and the thin wafer 310 has a diameter less than or equal to the support wafer 305. The bottom surface 310a of the thin wafer 310 is attached to the upper surface 305a of the support wafer 305 to form the assembly 306. The support wafer 310 provides a means for allowing existing process equipment such as loadlock chambers, process chambers, platens, and storage cassettes to easily handle these thin wafers without damage. In addition, by utilizing a standard size support wafer 305, it obviates the need to retrofit existing handling tools used with implanter 100 and other deposition tools to accommodate thin wafer processing.

Figure 3:
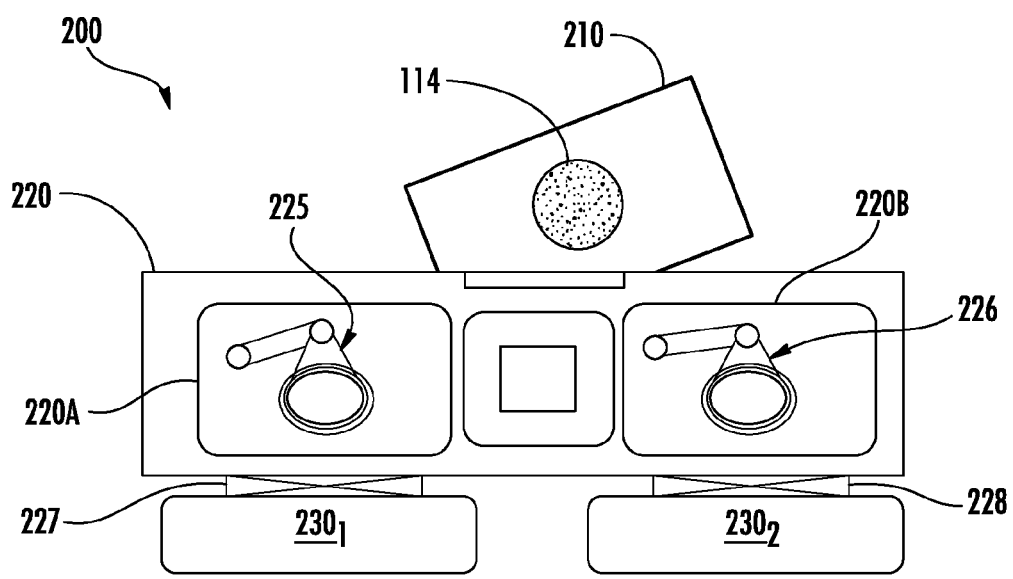
FIG. 3 is a top view of a representative vacuum processing system of an ion implanter.

FIG. 3 is a top plan view of an exemplary vacuum processing system 200 associated with an ion implanter 100 shown in FIG. 1 which includes process chamber 210, transfer chamber 220, and loadlock chambers $230_1$, $230_2$. The processing system is disposed downstream of the ion beam and is used to supply target wafers such as wafer assembly 306 to platen 114 for implantation. Unprocessed thin wafer assemblies or combinations 306 stored in loadlock chambers are transferred to process chamber 210 and transferred back to one of the loadlocks after processing. Loadlock chambers house a plurality of these wafer combinations 306 which have been or are awaiting processing. In particular, a loadlock chamber may include plurality of cassettes which house the plurality of wafer combinations 306. The wafers are stacked vertically within a cassette and are spaced sufficiently apart for wafer handling robot arms to reach under a particular wafer to remove it from or place it in a respective loadlock $230_1$ . . . $230_N$. By utilizing a support wafer 305 underneath the thin wafer 310, the wafer combinations 306 do not sag or bend when stored in the cassettes as would be the case if the thin wafer 310 was not supported by wafer 305.

Transfer chamber 220 has a first portion 220A which houses a first substrate handling robot 225 and a second portion 220B which houses a second substrate handling robot 226. Each robot 225, 226 retrieves the wafer combination 306 from respective loadlocks $230_1$, $230_2$ via slit or isolation valves 227, 228 and transfers the wafer combinations to processing chamber 210. Each handling robot 225, 226 positions a wafer combination 306 on platen 114 of process chamber 210. It is important to note that platen 114 is smaller (in diameter) than the support wafer 305 portion of combination 306 so that the platen 114 is not exposed to the ion beam. Once the thin wafer 310 portion of the wafer combination 306 has undergone processing, such as by ion implantation in process chamber 210, robot arm 225 retrieves the wafer combination 306 and transfers it to portion 220A of transfer chamber 220. The processed wafer combination 306 is then transferred to loadlock $230_1$ via slit valve 227. Similarly, robot arm 226 retrieves a wafer combination 306 and transfers it to portion 220B of transfer chamber 220 onto loadlock via slit valve 228. By utilizing a support wafer 305 underneath the thin wafer 305, the robot arms are able to select the thin wafers for transfer to a processing chamber without retrofitting the robot arms to provide support underneath the thin wafers during transfer.

Figure 4:
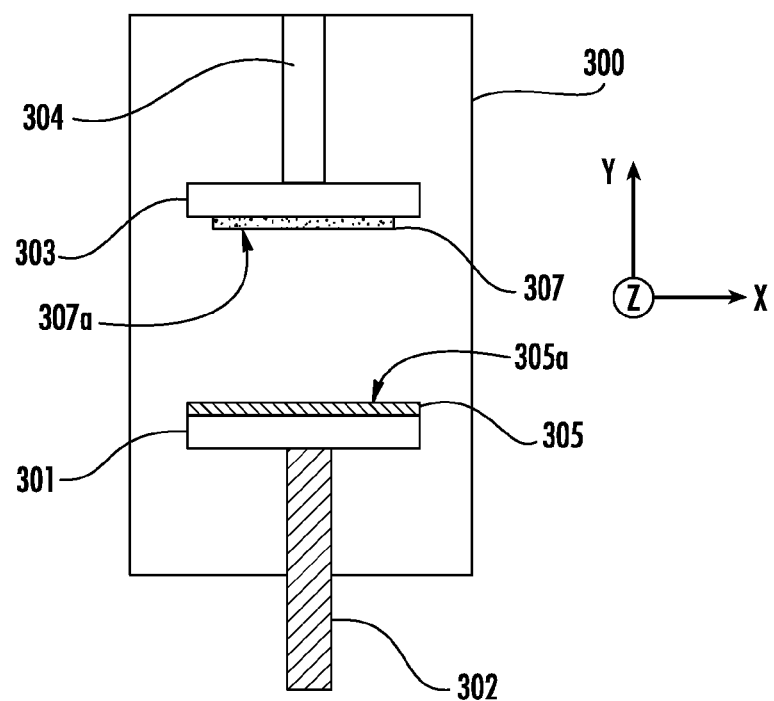
FIGS. 4 and 5 are cross-sectional views of a vacuum chamber configured to form the wafer assembly in accordance with an embodiment of the present disclosure.

FIG. 4 is a diagram of a vacuum chamber 300 used to temporarily bond the support wafer 305 to the thin target wafer 310 to form combination 306 shown in FIG. 2 and allow the thin target wafer to be handled by existing processing tools as explained above with respect to FIG. 3. In particular, chamber 300 is kept at a vacuum and includes a pedestal supported by a threaded screw 302. As screw 302 is rotated, pedestal 301 moves vertically in the Y direction. The support wafer 305 is disposed on pedestal 301 and temporarily retained thereon using a double sided tape. Support wafer 305 may be a standard wafer (200 mm or 300 mm) having a diameter equal to or larger than the target wafer 310. A release tape 307 is disposed on pedestal 303 which is attached to support 304. Release tape 307 (also referred to as "bonding tape" or "die grinding tape") has a particular thickness and associated release temperature. An example of such a release tape is No. 31951-5h and No. 3195hw available from Nitto Denko Corp, but of course alternative double-sided release tapes having various release temperature ranges and material thicknesses can be used. A first surface 307a of release tape 307 is exposed and upper surface 305a of support wafer 305 comes in contact with surface 307a by rotating screw 302 forcing pedestal 301 and consequently support wafer 305 in direction Y until it comes in contact with exposed adhesive surface 307a.

Figure 5:
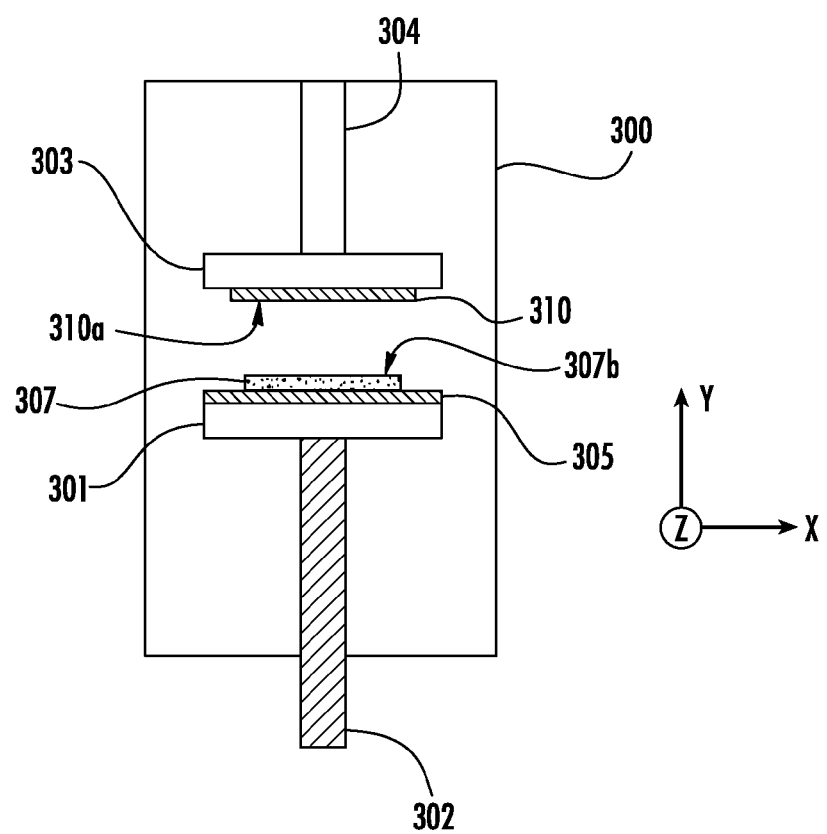
Figure 7:
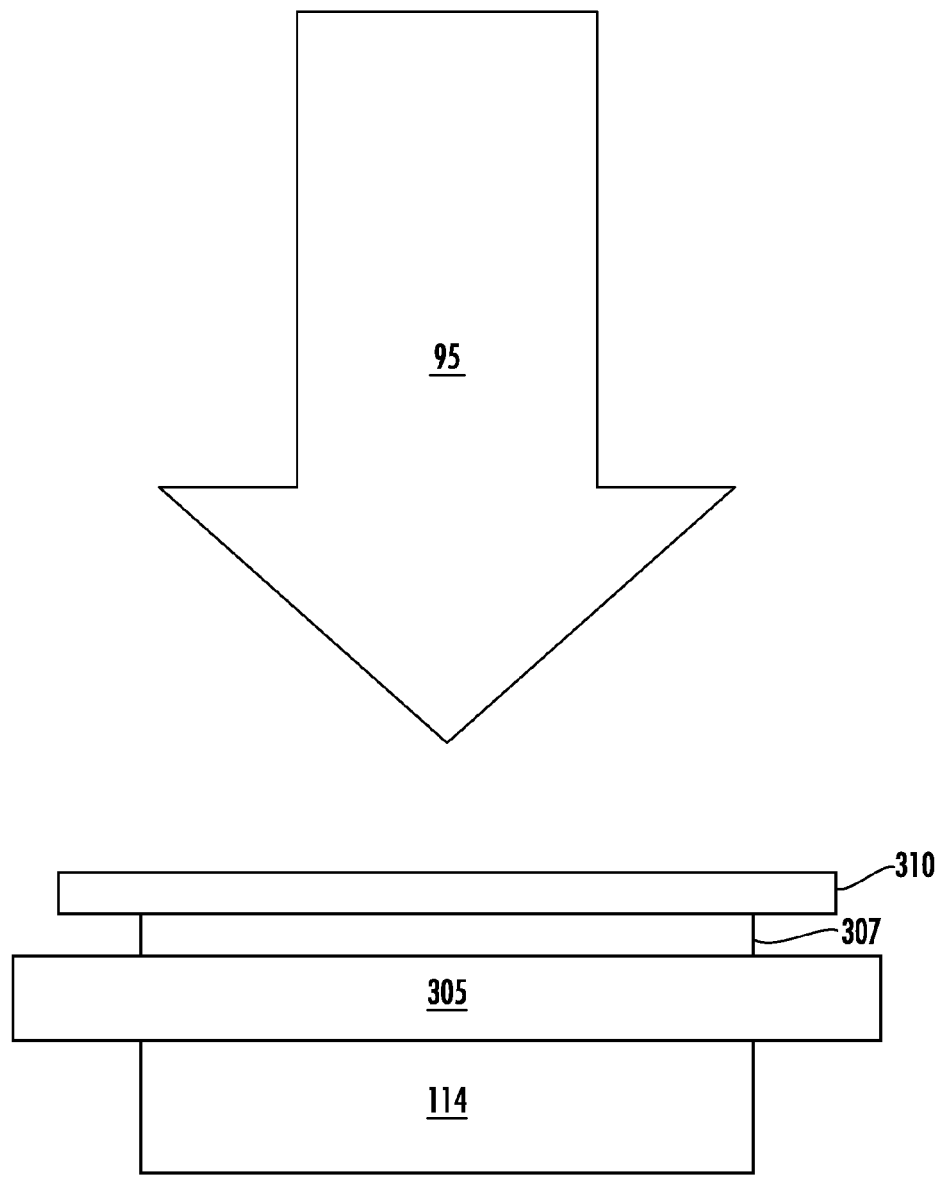
FIG. 7 is a side view illustrating an exemplary wafer assembly and platen in accordance with an embodiment of the present disclosure.

FIG. 5 illustrates chamber 300 in which thin wafer 310 is adhered to support wafer 305. In particular, the target wafer 310 is positioned above adhesive layer 307 by attaching the target wafer to pedestal 303 using a second double sided tape to temporarily retain the target thin wafer in place. A second surface 307b of adhesive layer 307 is exposed and pedestal 301 is lifted via screw 302 to force surface 307b to contact the lower surface 310a of target wafer 310. As can be seen, the adhesive is smaller than the target wafer 310. As shown in FIG. 7, the support wafer 305 may be disposed upon the platen 114, such as during processing of the target wafer 310. The amount that the adhesive layer 307 is smaller than the target wafer 310 is proportional to the amount that the platen 114 is smaller than the target wafer 310 such that the adhesive layer 307 is not exposed to the incident ions from ion beam 95 during implantation. Referring back to FIG. 5, since the target wafer 310 is bonded to the support wafer 305 in chamber 300 which is held at a vacuum, no air pockets are formed in the adhesive layer 307 which would otherwise compromise the bond between the support wafer 305 and thin target wafer 310 as well as jeopardizing the integrity of the implant in target wafer 310 during cooling. In this manner, the thin target wafer 310 is temporarily bonded on support wafer 305 and may be used with existing handling tools in implanter 100. Once the target thin wafer has undergone the desired implant process, the support wafer 305 and target thin wafer 310 may be inserted back into chamber 300 and heated to the release point of adhesive 307 to separate the target thin wafer 310 from the support wafer 305. Typically release temperatures for exemplary bonding tape may be approximately 90° C.-100° C. In an alternative embodiment, the chamber 300 is obviated and the target thin wafer 310 is manually pressed on top of support wafer 305 with the double sided release tape disposed therebetween. In particular, a double sided release tape may be disposed on either the lower surface of the thin target wafer 310 or the upper surface of support wafer 305. The lower surface of the thin target wafer 310 is positioned on the upper surface of support wafer 305 such that the double-sided release tape creates a bond between the wafers to form a wafer assembly 306 (as shown in FIG. 2). The wafers are then pressed together using, for example, a relatively light rolling pressure such that the air bubbles are removed between the support wafer 305 and target thin wafer 310. The pressure applied to the assembly is relatively light to ensure that the wafers are joined, but that the thin target wafer is not damaged. In this manner, the relatively light pressure may be applied to the undersurface of the support wafer rather than to the top (or implant) surface of the target thin wafer 305.

Figure 6:
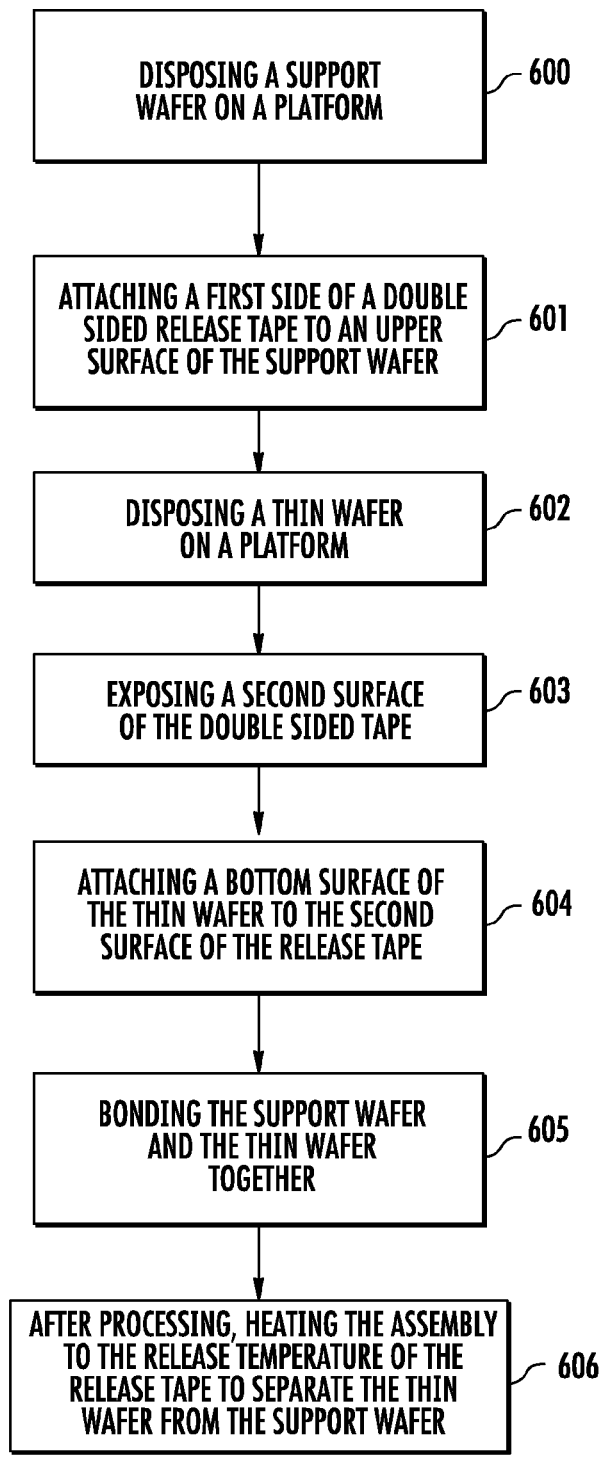
FIG. 6 is a flow chart of exemplary wafer processing steps utilizing the vacuum chamber of FIGS. 4, 5 in accordance with an embodiment of the present disclosure.

FIG. 6 is a flow chart illustrating an exemplary process for forming a wafer combination 306 utilizing a thin wafer 310 and support wafer 305. At step 600, a support wafer 305 is disposed on platform 301. A first side 307a of a double sided release tape is attached to an upper surface 305a of the support wafer 305 at step 601. At step 602, a thin wafer 310 is disposed on platform 303 and a second surface 307b of release tape 307 is exposed at step 603. At step 604, the second surface of the release tape is attached to the bottom surface of the thin wafer. At step 605, the support wafer and thin wafer are bonded together using release tape 307 such that the first side of the double sided release tape adheres to the upper surface of the support wafer and the second surface of the release tape adheres to the bottom surface of the thin wafer to form a wafer assembly. After processing of the thin wafer 310, the assembly is heated to the release temperature of release tape 307 and the thin wafer is separated from the support wafer at step 606.

The method described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art would include such devices as a readable or writeable CD, flash memory chips (e.g., thumb drives), various magnetic storage media, and the like.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A semiconductor wafer assembly for processing substrates comprising:
   a support wafer;
   a thin target wafer bonded to said support wafer using a double-sided release tape disposed therebetween, said release tape having a release temperature at which said bond between the support wafer and the thin target wafer is released; and
   a platen upon which the support wafer is disposed, the platen having a diameter smaller than a diameter of the support wafer to shield the platen from an ion beam directed at the thin target wafer during an ion implantation process;
   wherein the release tape has a surface area, the thin target wafer has a surface area, and the platen has a surface area, the release tape surface area being smaller than the thin target wafer surface area by a first amount, the surface area of the platen being smaller than the surface area of the thin target wafer by a second amount, and the first amount being proportional to the second amount to shield the release tape from an ion beam directed at the thin target wafer during the ion implantation process.

2. The semiconductor wafer assembly of claim 1 wherein said support wafer has a thickness that is greater than a thickness of said thin target wafer.

3. The semiconductor wafer assembly of claim 1 wherein the thin target wafer has a diameter that is less than or equal to the diameter of the support wafer.

4. The semiconductor wafer assembly of claim 1 wherein the bonding tape is disposed between the support wafer and the thin target wafer such that the bonding tape has a surface area which is less than a surface area of said thin target wafer.

5. The semiconductor wafer assembly of claim 1 wherein the thin target wafer has a thickness of less than 250 um.

6. The semiconductor wafer assembly of claim 1 wherein the diameter of the support wafer is 200 mm.

7. The semiconductor wafer assembly of claim 1 wherein the diameter of the support wafer is 300 mm.

8. A semiconductor wafer assembly for processing substrates comprising:
   a target wafer, a support wafer, and a platen upon which the support wafer is disposed;
   wherein the target wafer is bonded to said support wafer using a double-sided release tape disposed therebetween; and
   wherein the platen has a diameter smaller than a diameter of the support wafer;
   wherein the release tape has a surface area, the target wafer has a surface area, the platen has a surface area, the release tape surface area that is smaller than the target wafer surface area by a first amount, the surface area of the platen is smaller than the surface area of the target wafer by a second amount, and the first amount is proportional to the second amount to shield the release tape from an ion beam directed at the target wafer during the ion implantation process.

9. The semiconductor wafer assembly of claim 8 wherein said support wafer has a thickness that is greater than a thickness of said target wafer.

10. The semiconductor wafer assembly of claim 8 wherein the target wafer has a diameter that is less than or equal to the diameter of the support wafer.

11. The semiconductor wafer assembly of claim 8 wherein the bonding tape is disposed between the support wafer and the target wafer such that the bonding tape has a surface area which is less than a surface area of said target wafer.

12. The semiconductor wafer assembly of claim 8 wherein the target wafer has a thickness of less than 250 μm.

13. The semiconductor wafer assembly of claim 8 wherein the diameter of the support wafer is 200 mm.

14. The semiconductor wafer assembly of claim 8 wherein the diameter of the support wafer is 300 mm.

* * * * *